(12) United States Patent
Jung et al.

(10) Patent No.: US 12,273,639 B2
(45) Date of Patent: Apr. 8, 2025

(54) ELECTRICAL PHASE DETECTION AUTO FOCUS

(71) Applicant: OMNIVISION TECHNOLOGIES, INC., Santa Clara, CA (US)

(72) Inventors: Young Woo Jung, Campbell, CA (US); Chih-Wei Hsiung, San Jose, CA (US); Vincent Venezia, Los Gatos, CA (US); Zhiqiang Lin, Fremont, CA (US); Sang Joo Lee, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 89 days.

(21) Appl. No.: 17/893,689

(22) Filed: Aug. 23, 2022

(65) Prior Publication Data

US 2024/0073559 A1 Feb. 29, 2024

(51) Int. Cl.
*H04N 25/704* (2023.01)
*H04N 23/67* (2023.01)
*H04N 25/709* (2023.01)
*H10F 39/00* (2025.01)
*H10F 39/18* (2025.01)

(52) U.S. Cl.
CPC ......... *H04N 25/704* (2023.01); *H04N 23/672* (2023.01); *H04N 25/709* (2023.01); *H10F 39/18* (2025.01); *H10F 39/8037* (2025.01); *H10F 39/8057* (2025.01); *H10F 39/811* (2025.01)

(58) Field of Classification Search
CPC .................................................. H04N 23/672
See application file for complete search history.

(56) References Cited

U.S. PATENT DOCUMENTS

| | | | | |
|---|---|---|---|---|
| 2008/0291311 A1* | 11/2008 | Kusaka | .................. | H04N 25/77 348/308 |
| 2014/0014818 A1* | 1/2014 | Cho | .................. | H01L 27/14601 257/435 |
| 2015/0319420 A1* | 11/2015 | Fettig | ................. | H01L 27/14621 348/49 |
| 2016/0198141 A1* | 7/2016 | Fettig | ................... | H04N 25/709 348/46 |
| 2019/0288132 A1* | 9/2019 | Wang | .................. | H01L 31/1804 |
| 2020/0045223 A1 | 2/2020 | Pang et al. | | |
| 2022/0344383 A1* | 10/2022 | Kao | .................. | H01L 27/14627 |

\* cited by examiner

*Primary Examiner* — Christopher K Peterson
(74) *Attorney, Agent, or Firm* — Christensen O'Connor Johnson Kindness PLLC (57) ABSTRACT

Electrical Phase Detection Auto Focus. In one embodiment, an image sensor includes a plurality of pixels arranged in rows and columns of a pixel array disposed in a semiconductor material. Each pixel includes a plurality of photodiodes configured to receive incoming light through an illuminated surface of the semiconductor material. The plurality of pixels includes at least one autofocusing phase detection (PDAF) pixel having: a first subpixel without a light shielding, and a second subpixel without the light shielding. Autofocusing of the image sensor is at least in part determined based on different electrical outputs of the first subpixel and the second sub pixels.

13 Claims, 11 Drawing Sheets

ELECTRICAL PHASE DETECTION AUTO FOCUS

BACKGROUND INFORMATION

Field of the Disclosure

This disclosure relates generally to the design of image sensors, and in particular, relates to image sensors that use electrical phase detection to improve autofocusing of the image sensor.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

In some applications, auto focusing of the image sensor depends on dedicated groups of pixels that engage in phase detection auto focus (PDAF). It is known that autofocusing may be achieved by a differential shielding of light that impinges on photodiodes of the pixels. That is, select photodiodes (PDs) are shielded from light using light shielding structures, while their neighboring PDs lack light shielding structures, resulting in an uneven illumination as a basis for PDAF. Next, digital outputs of the adjacent photodiodes (optically shielded and not optically shielded) are compared to execute autofocusing.

However, manufacturing of such differential shielding structures is subject to process variations. In practice, a half-shielded pixel is difficult to manufacture, may cause defects, require optimization, generate differences between center/edge pixels, etc. Therefore, systems and methods that can provide improved autofocusing while limiting process variations are still needed.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors with microlenses that are arranged to improve resolution and autofocusing of the image sensor are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the term "about" means +/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to image sensors having photodiodes (PDs) capable of autofocusing based on electrical signals, without having to resort to differential optical shielding. In some embodiment, selected PDs are electrically connected to a known electrical potential, therefore producing a digital output that is equivalent to, for example, fully optically shielded PD. A person of ordinary skill would understand that individual PDs may produce different electrical outputs even when not exposed to light. Therefore, connecting a PD (or a part of its readout circuit) to a given voltage provides a more realistic emulation of the shielded PDs when performed on physical PDs (however many are selected for the PDAF), as opposed to attempting to simulate the shielded PDs in a digital domain.

In some embodiments, such connection of the select PDs to a known electrical potential may be achieved by connecting the photodiode to the pixel voltage supply (PIXVD) to guarantee an expected output that corresponds to a fully optically shielded PD. In some embodiments, the select photodiodes may be connected to the pixel voltage supply through a shallow well (e.g., through a weekly doped semiconductor).

In some embodiments, a doping step for the strongly doped region of semiconductor is omitted for selected photodiodes, thus these selected subpixels generate no electrical charge when illuminated, which again approximates a fully optically shielded PD. In other embodiments, the transfer transistor (TX) or other elements in the readout circuit may be kept OFF by keeping transistor gate at a certain predetermined voltage, therefore preventing a discharge and subsequent readout of the accumulated charge.

In other embodiments, additional metallization element(s) may be added to select photodiodes to assure their shorting to, for example, the pixel voltage supply or other known voltage. Such additional metallization may take form of metal jumpers, or combinations of metal elements and doped semiconductors that collectively assure that a target voltage is produced by the select photodiodes used for autofocusing. As explained above, the additional metallization (or other customization of a photodiode) is performed on the target photodiodes only, that is on the photodiodes that are dedicated for the PDAF function, and not on all photodiodes/pixels. Therefore, in many cases the manufacturing penalty of the additional/different manufacturing steps is acceptable in view of the desired outcome, i.e., improved PDAF function.

Figure 1:
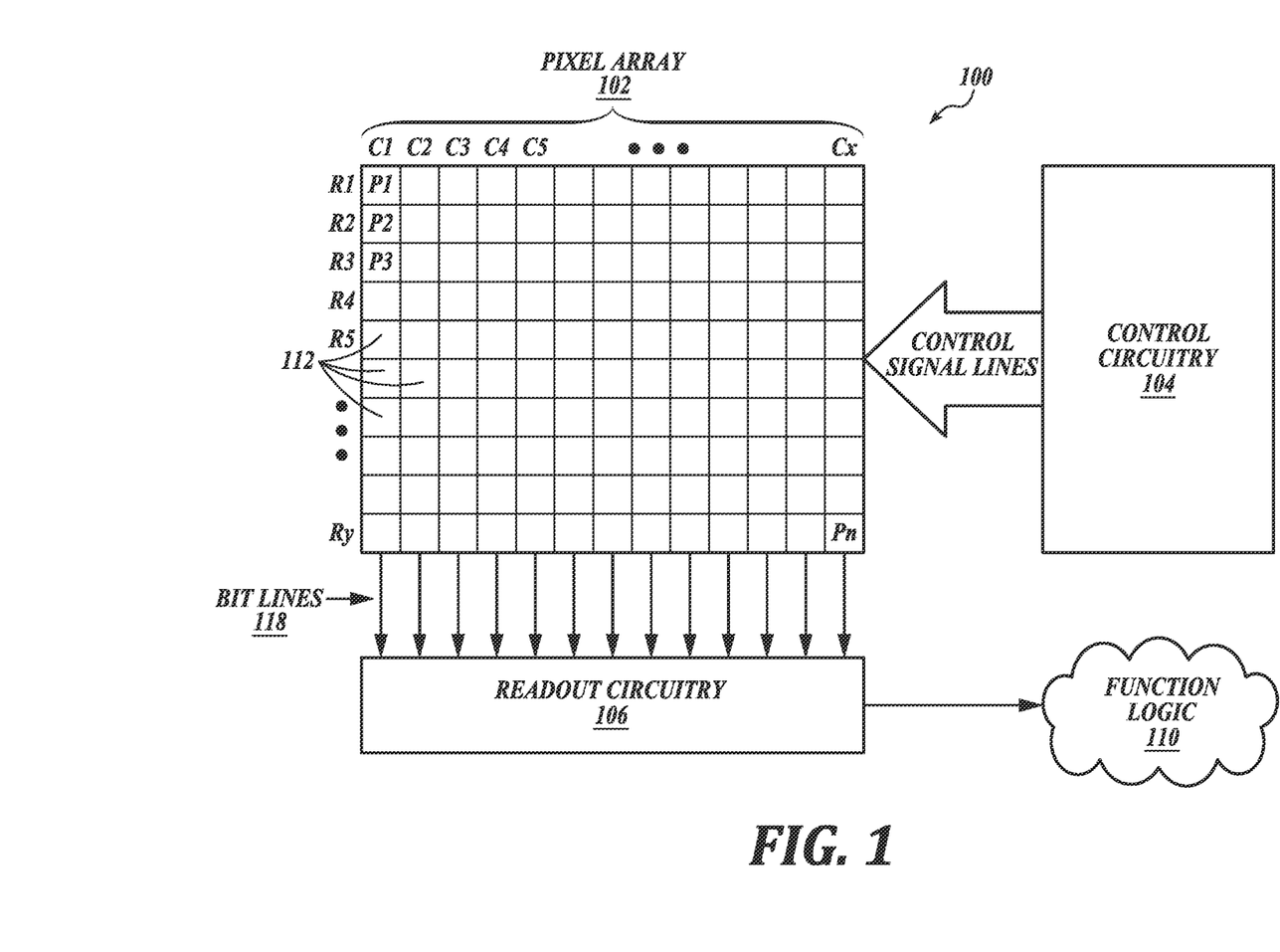
FIG. 1 is a diagram of an example image sensor in accordance with an embodiment of the present technology.

FIG. 1 is a diagram of an example image sensor in accordance with an embodiment of the present technology. The imaging system 100 includes pixel array 102, control circuitry 104, readout circuitry 106, and function logic 110. In one example, the pixel array 102 is a two-dimensional (2D) array of photodiodes, or image sensor pixels 112 (e.g., pixels P1, P2 . . . , Pn). As illustrated, the photodiodes are arranged into rows (e.g., rows R1 to Ry) and columns (e.g., column C1 to Cx). In operation, the photodiodes acquire image data of a person, place, object, etc., which can then be used to render a 2D image of the person, place, object, etc. However, the photodiodes do not have to be arranged into rows and columns and may take other configurations.

In an embodiment, after each pixel 112 in pixel array 102 has acquired its image data or image charge, the image data is read out by a readout circuitry 106 via bitlines 118, and then transferred to a function logic 110. In various embodiments, the readout circuitry 106 may include signal amplifiers, analog-to-digital (ADC) conversion circuitry, and data transmission circuitry. The function logic 110 may store the image data or even manipulate the image data by applying post image effects (e.g., crop, rotate, remove red eye, adjust brightness, adjust contrast, or otherwise). In some embodiments, the control circuitry 104 and function logic 110 may be combined into a single functional block to control the capture of images by the pixels 112 and the readout of image data from the readout circuitry 106. The function logic 110 may be a digital processor, for example. In one embodiment, the readout circuitry 106 may readout a row of image data at a time along readout column lines (as illustrated) or may readout the image data using a variety of other techniques (not illustrated), such as a serial readout or a full parallel readout of all pixels simultaneously.

In one embodiment, the control circuitry 104 is coupled to the pixel array 102 to control operation of the plurality of photodiodes in the pixel array 102. For example, the control circuitry 104 may generate a shutter signal for controlling image acquisition. In one embodiment, the shutter signal is a global shutter signal for simultaneously enabling all pixels within pixel array 102 to simultaneously capture their respective image data during a single acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash.

In one embodiment, data transmission circuitry 108 may receive image data from analog-to-digital converters (ADCs), thus converting analog image data into digital representations of the same. The digital representation of the image data is provided to the function logic 110. In some embodiments, the data transmission circuitry 108 may receive the digital representations of the image data from the ADCs in parallel and provide the same to the function logic 110 in series.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
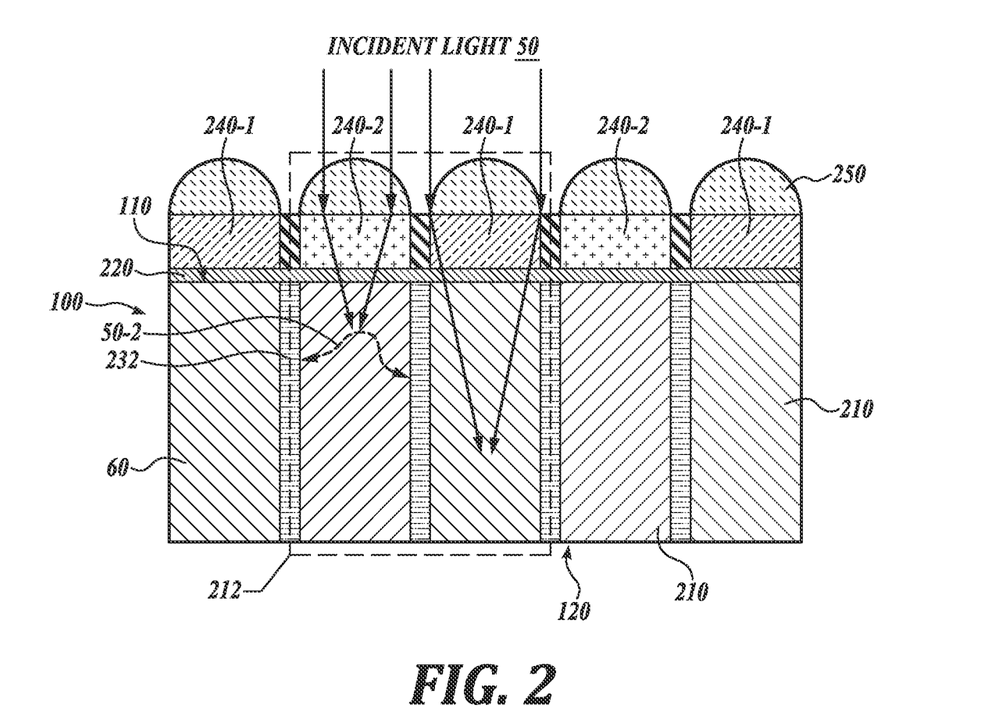
FIG. 2 is a cross-sectional side view of an example image sensor in accordance with embodiments of the present technology.

FIG. 2 is a cross-sectional side view of an example image sensor in accordance with embodiments of the present technology. In operation, incident light 50 (electromagnetic radiation) enters the image sensor 100 through microlenses 250 and color filters 240 at a backside 110, which focus and appropriately color-filter the incident light for a given photodiode (PD) 210 inside a semiconductor material 60 (e.g., doped silicon). For example, a green photodiode 210 may be covered by a green color filter 240 that transmits green light, while reflecting other wavelengths of light. In some embodiments, a dielectric layer 220 (also referred to as a planarization layer or buffer oxide layer) separates the color filters 240 from the photodiodes 210. The color filters 240 may be configured to transmit green (G), red (R) or blue (B) light to their corresponding photodiodes, or to transmit all light (referred to as clear or C color filters and photodiodes). A frontside of the image sensor is labeled as 120. Photodiodes 210 operate to photogenerate electrical charge based on the incoming light 50. These electrical charges are subsequently selectively drained into the associated supporting electronics of the photodiode 210, for example, to a floating diffusion associated with the photodiode 210 through a respective coupled transfer transistor.

The photodiodes 210 may be prone to crosstalk. For example, the incoming light 50, for example light of longer wavelength such as red or infrared light may enter a PD 210 through a microlens 250 and a color filter 240-2, where the light is partially absorbed and partially transmitted in the direction of the neighboring PD 210, for example by refraction or reflection induced crosstalk. Such optical crosstalk occurs without the light passing through color filter 240-1 as designed for. Therefore, in some embodiments, the neighboring photodiodes 210 are separated by isolation structures 232 that limit propagation of stray light from one photodiode to another. Some examples of such isolation structures are deep trench isolation (DTI) structures 232 that vertically extend up to a depth (e.g., 1.5 um to 2.5 um) into the Silicon (Si) material from a backside 110 of the semiconductor material 60 (illuminated side of the image sensor). In different embodiments, the DTI structure 232 may include materials that are non-transparent to light, for example metals. In some embodiments, the DTI structure 232 may include dielectric material with refractive index lower than the semiconductor material 60, such as silicon oxide. The DTI structure 232 may prevent or at least reduce the stray light 50-2 from reaching the neighbor photodiodes. The illustrated DTI structures 232 extend essentially throughout the entire thickness of the Si material layer, but in different embodiments the DTI structures may extend only partially between the adjacent photodiodes. In one example, DTI structures 232 are interconnected thus forming a grid structure surrounding the PDs 210 and providing electrical and/or optical isolation between adjacent PDs.

Figure 3:
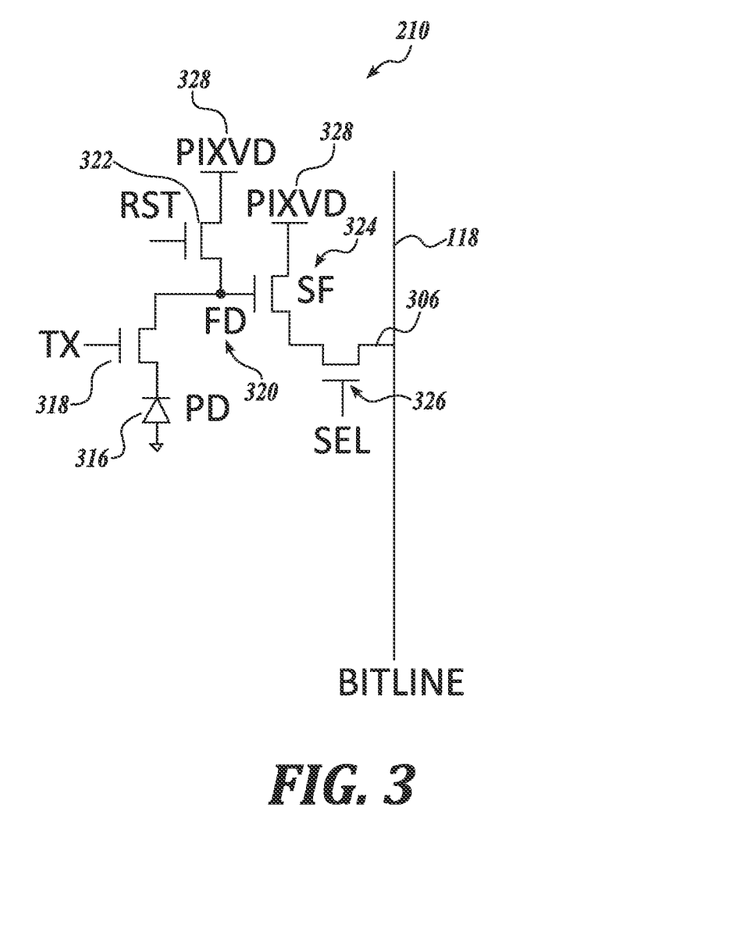
FIG. 3 shows an electrical schematic of an example pixel cell in an image sensor in accordance with embodiments of the present technology.

FIG. 3 shows an electrical schematic of an example pixel cell in an image sensor in accordance with embodiments of the present technology. FIG. 3 is a circuit diagram of a sample four transistor (4T) pixel cell in accordance with an embodiment of the present invention. It is appreciated that pixel cell 210 of FIG. 2 may be an example of a pixel cell 110 of FIG. 1, and that similarly named and numbered elements referenced below may be coupled and function similarly. For example, the pixel cell 210 may be coupled to a bitline 118, e.g., readout column, which may provide image data to readout circuitry, such as the readout circuitry 106. The pixel cell 210 may receive control signals from control circuitry, such as control circuitry 104, to control the operation of the various transistors of the pixel cell 210. The control circuitry may control the operation of the transistors in desired sequences with relative timing in order to reset the pixel to a dark state and to read out image data after an integration, for example.

The illustrated example of the pixel cell 210 includes a photosensitive or photoelectric conversion element, such as a photodiode (PD) 316. In operation, the PD 316 photogenerates an electrical charge in response to incident light.

Pixel cell 210 also includes a transfer gate transistor (TX) 318 and a floating diffusion (FD) 320. In operation, the TX 318 transfers image charge from the PD 316 to the FD 320 in response to a transfer gate signal. A reset transistor (RST) 322 couples a power supply voltage (PIXVD, also referred to as VDD) 328 to the FD 320 to reset the pixel cell 210 (e.g., to discharge or charge the photodiode and the floating diffusion to a preset voltage) in response to a reset signal. The gate terminal of an amplifier transistor (also referred to as a source follower or SF) 324 is coupled to the FD (320) to generate an image data signal in response to the image charge in the FD. A row select transistor (also referred to as RS or SEL) 326 is coupled to the SF 324 to output the image data signal 306 to an output bitline 118. The analog data signal is further processed to generate a digital output that is representative of the light intensity at a given photodiode.

Figure 4:
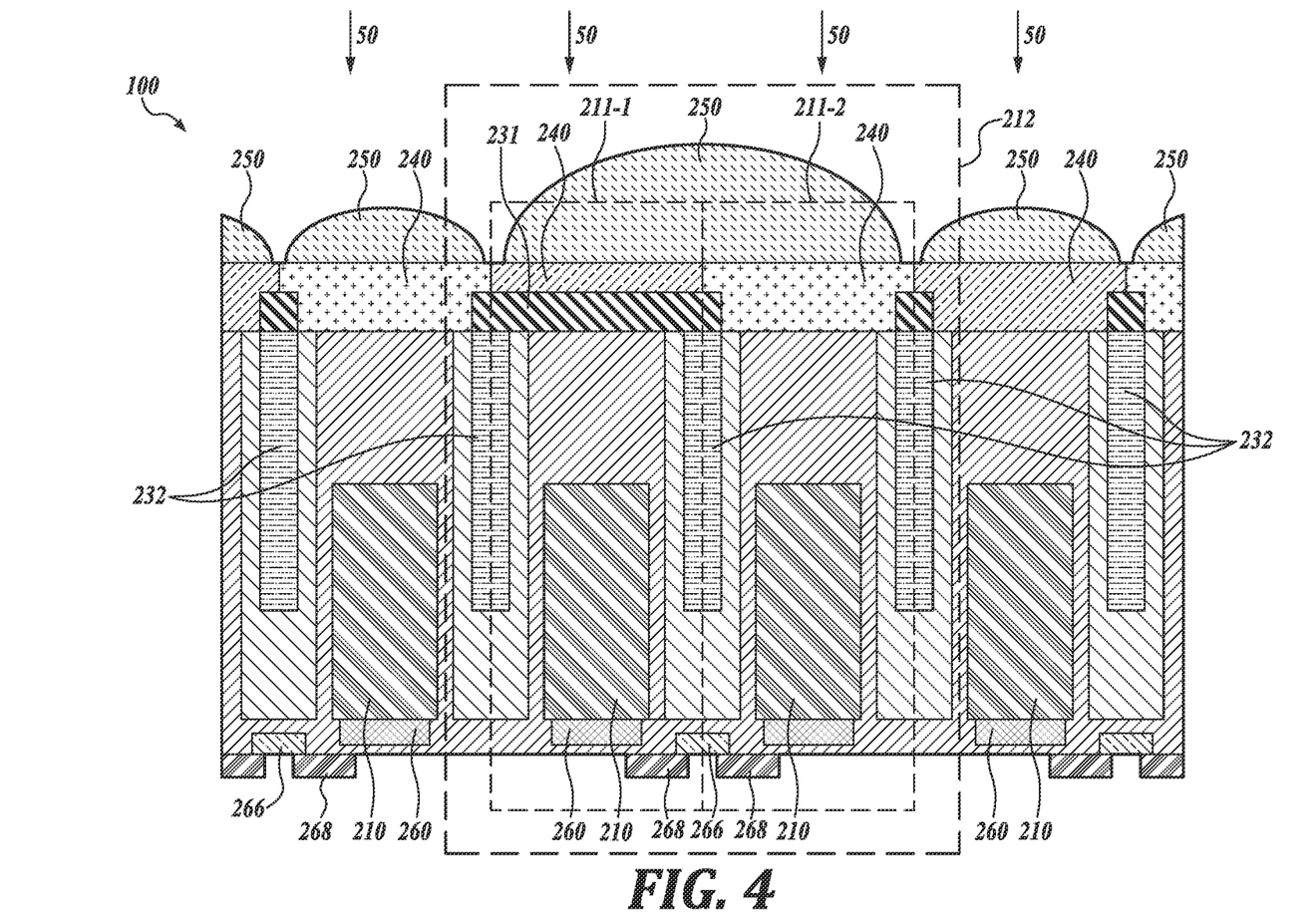
FIG. 4 is a cross-sectional side view of an example image sensor in accordance with embodiments of the present technology.

FIG. 4 is a cross-sectional side view of an example image sensor in accordance with embodiments of the present technology. In operation, light 50 enters the photodiodes 210 through lenses 250 and color filters 240. The illustrated embodiment includes small lenses 250 that cover one photodiode 210, and large lenses 250 that cover multiple photodiodes 210. In some embodiments, individual photodiodes are separated by isolation structures 232 (e.g., deep trench isolation or DTI). Electrical charge accumulated by photodiodes 210 is transferred through a shallow well (e.g., lightly doped well) 260 and metallization (e.g., metal traces) 268 toward the hold and sample circuit (not shown).

In the illustrated embodiment, pixel 212 includes subpixels 211-1 and 211-2 that are covered by same lens (also referred to as a microlens) 250. Such arrangement generally corresponds to a pixel 212 having a 2×2 subpixel 211 layout, but other embodiments, for example 2×1 subpixel layouts, are also possible. The subpixel 211-1 is covered by a light shielding 231 that prevents or at least reduces incoming light 50 on the corresponding photodiode 210. As explained above, such differential exposure to light may be used for autofocusing. Stated differently, illustrated pixel 212 performs autofocusing function. In the context of this specification, the term subpixel 211 refers to a combination of photodiode 210, metallization, deep trench isolation, color filter, and other associated elements. However, a person of ordinary skill will know that the terms photodiode and subpixel (or pixel) are sometimes used interchangeably in the industry.

Figure 5:
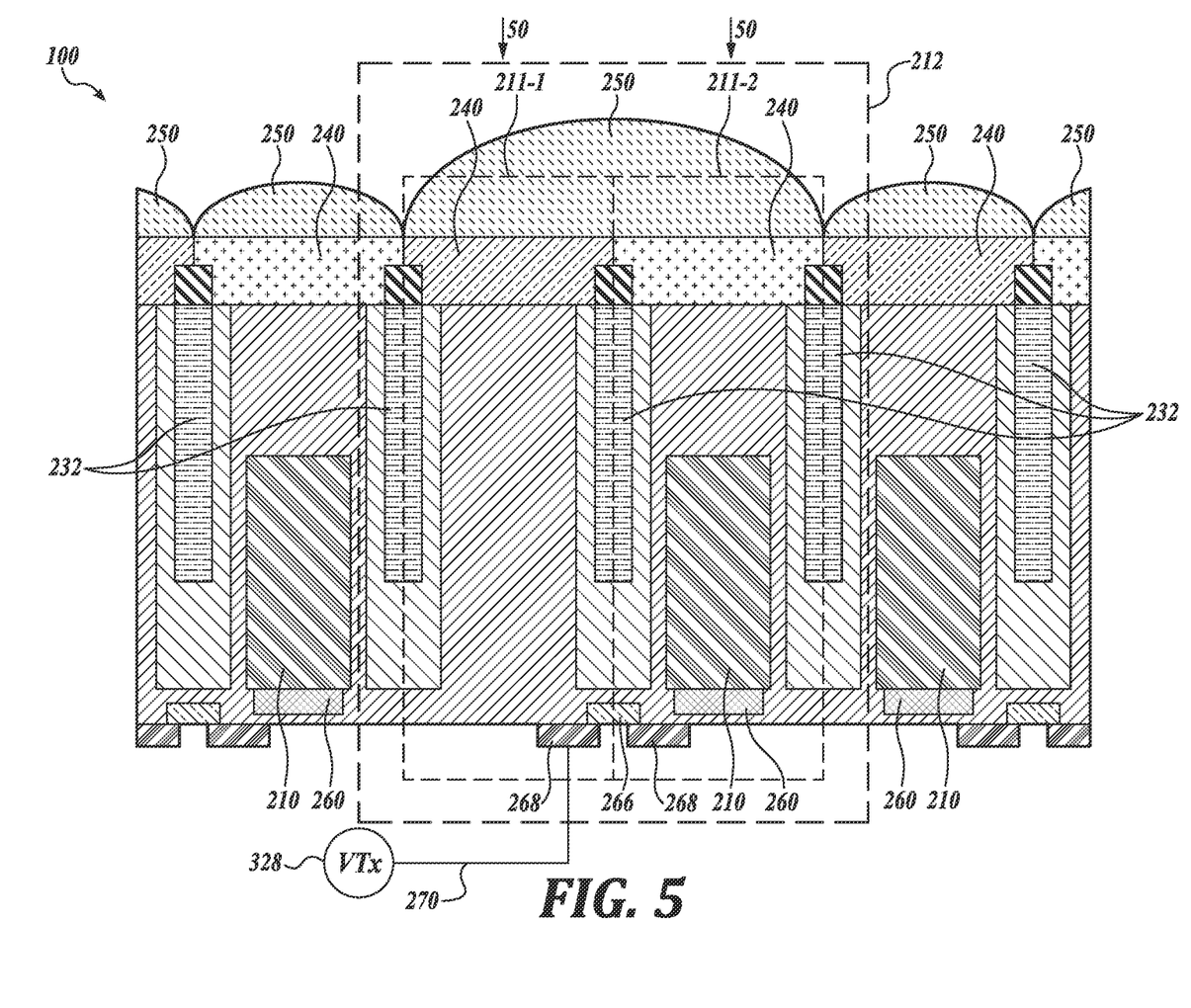
FIG. 5 is a cross-sectional side view of example image sensor in accordance with embodiments of the present technology.

FIG. 5 is a cross-sectional side view of example image sensor in accordance with embodiments of the present technology. In the illustrated embodiment, pixel 212 performs the autofocusing function by producing differing output from subpixels 211-1 and 211-2. In particular, subpixel 211-1 does not include the photodiode 210, therefore the subpixel 211-1 produces no electrical charge or at least significantly reduced electrical charge when illuminated. The subpixel 211-2, having a photodiode 210 (e.g., a heavily doped semiconductor), produces an electrical charge in proportion to the intensity of incoming light 50. Therefore, when combined, the subpixels 211-1 and 211-2 can execute the autofocusing function. Collectively, the subpixels 211-1 and 211-2 may be termed the autofocusing pixel 212.

In some embodiments, the subpixel 211-2 includes a shallow well 260 that forms a part of the electrical connection from the photodiodes to their corresponding TX metallization 268, and further to the bitline 118. However, the illustrated subpixel 211-1 does not include the shallow well 260 therefore further preventing any residual electrical charge from being drained through the TX (or, if drained, then in a significantly reduced amount).

A person of ordinary skill would know that even though the heavily doped photodiode 210 is not included in the subpixel 211-1, some charge accumulation may still occur when the subpixel 211-1 is illuminated because of the presence of the lightly doped areas within the subpixel 211-1. In some embodiments, the TX 318 of the pixel 211-1 may be kept in a predetermined state to further preventing accumulation of charge for the subpixel 211-1. Some examples of controlling the TX 318 in a predetermined state are described with respect to FIG. 6 below. In some embodiments, different elements of metallization 268 (also referred to as the gate 268) can be connected with shallow trench isolation (STI) 266.

Figure 6:
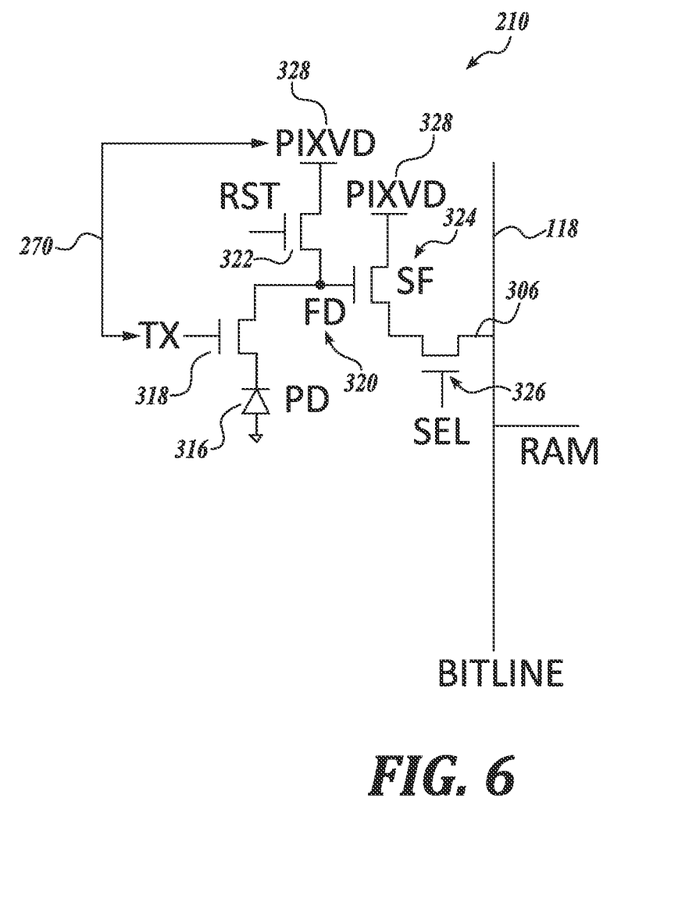
FIG. 6 shows an electrical schematic of an example of pixel cell in an image sensor in accordance with embodiments of the present technology.

FIG. 6 shows an electrical schematic of an example of pixel cell in an image sensor in accordance with embodiments of the present technology. In some embodiments, the TX 318 of the pixel 211-1 may be kept in the ON position (always high) for constant drainage, thus further preventing accumulation of charge for the subpixel 211-1. For example, a gate of the TX 318 may be connected to the PIXVDD (VDD) voltage to a permanent ON state during operation of the image sensor. In other embodiments, the TX 318 of the subpixel 211-1 may be kept in the OFF position (always low, i.e., a permanent OFF state during operation of the image sensor) to prevent the electrical charge accumulated by the subpixel 211-1 from reaching the bitline 118. The embodiment where the gate of the TX 318 is in the OFF position is not illustrated in FIG. 6, however, a person of ordinary skill would understand that such electrical state may be achieved by, for example, connecting the gate of TX 318 to ground. Accordingly, the above-described embodiments may further reduce light sensitivity of the subpixel 211-1.

Figure 7:
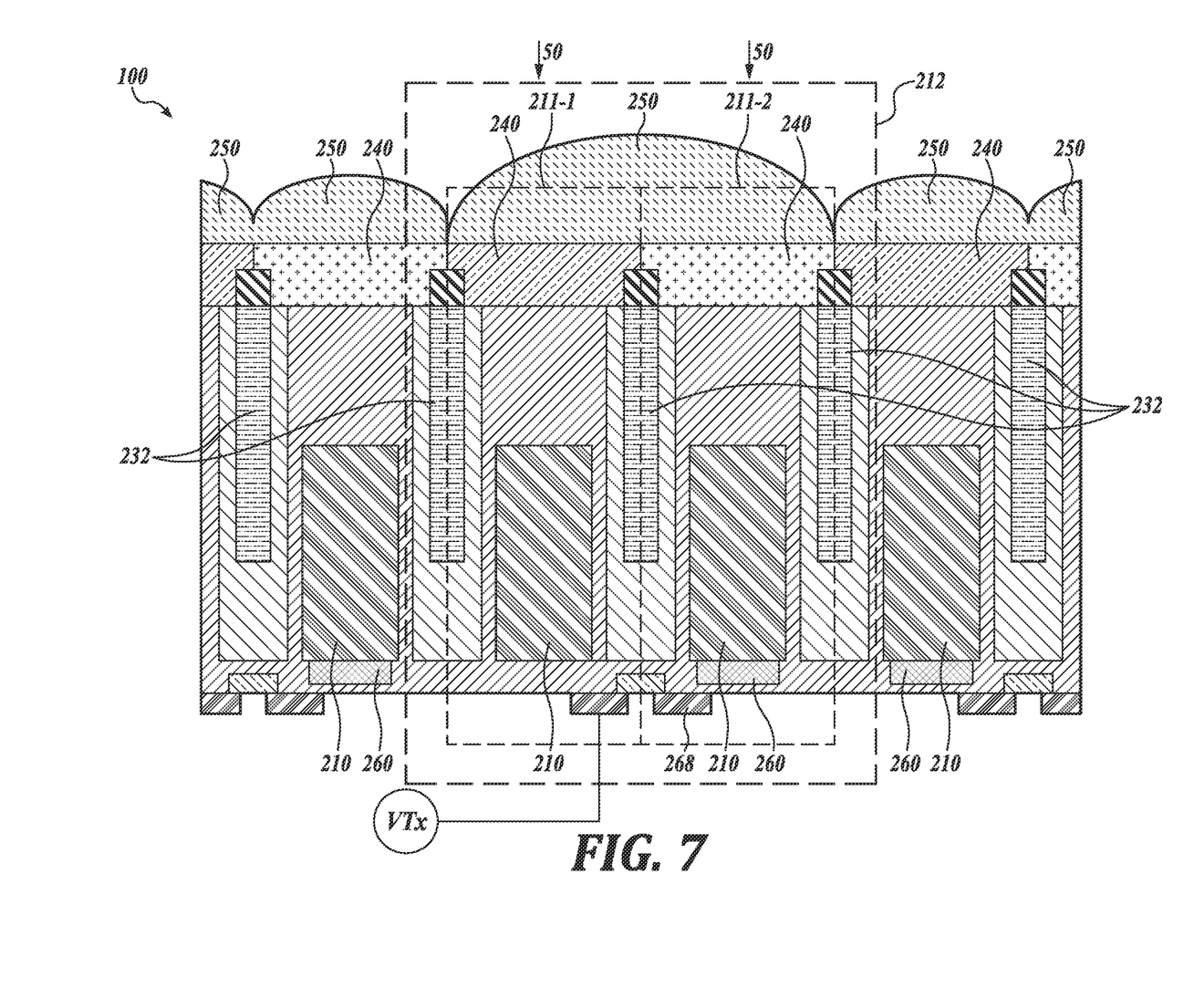
FIGS. 7 and 8 are cross-sectional side views of example image sensors in accordance with embodiments of the present technology.

FIG. 7 is a cross-sectional side view of an example image sensor in accordance with embodiments of the present technology. In the illustrated embodiment, the subpixel 211-1 includes a photodiode 210, but does not include a shallow well 260 that forms a part of the electrical connection of the photodiodes to their corresponding TX metallization 268. Therefore, even though the photodiode 210 of the subpixel 211-1 is capable of generating charge when illuminated, such electrical charge is not drained through the TX (or, if drained, then in a significantly reduced amount in comparison with the subpixels that include the shallow well 260). In some embodiments, the TX for the subpixel 211-1 may be additionally biased to OFF state to further prevent a transfer of any residual electrical charge to the bitline.

Figure 8:
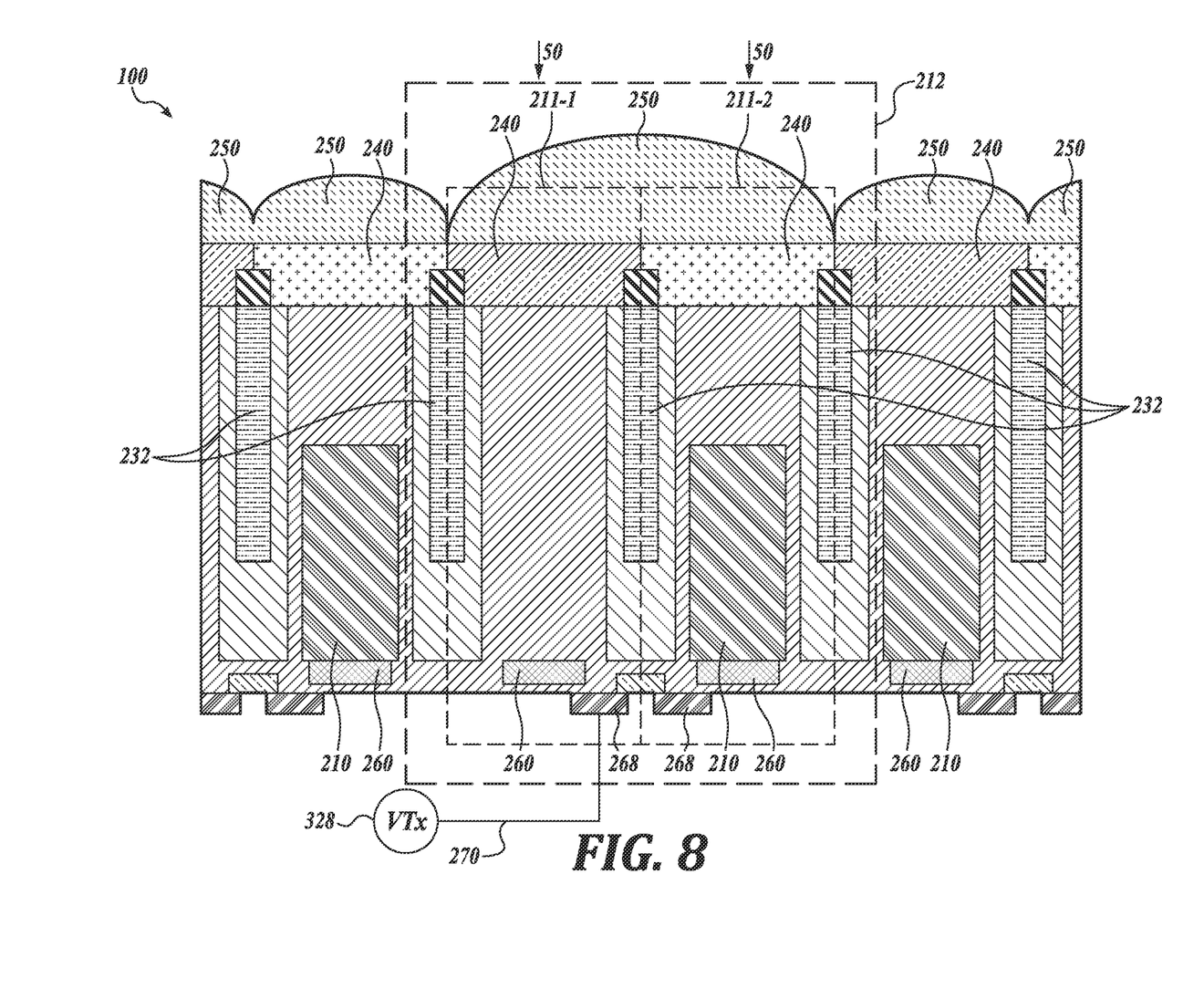

FIG. 8 is a cross-sectional side view of an example image sensor in accordance with embodiments of the present technology. In the illustrated embodiment, the subpixel 211-1 does not include a photodiode 210, but includes a shallow well 260. As explained above, even though the subpixel 211-1 does not include the photodiode, some residual charge may still be generated within the subpixel 211-1. Therefore, in some embodiments, the TX metallization 268 may be biased to always ON to assure constant drainage and to prevent accumulation of such residual charge.

Figure 9A:
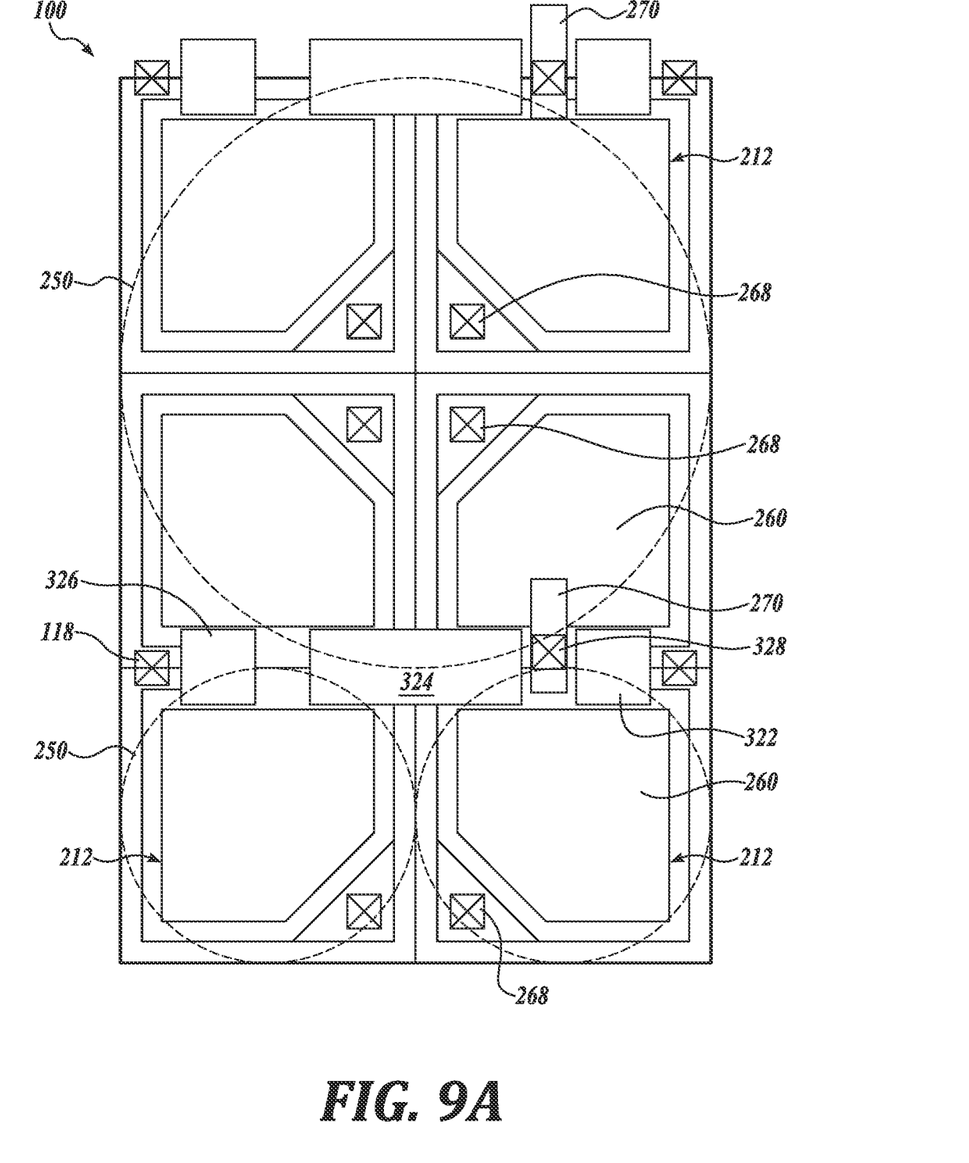
FIG. 9A is a front side view of an example image sensor in accordance with embodiments of the present technology.

FIG. 9A is a front side view of an example image sensor in accordance with embodiments of the present technology. In the illustrated embodiment, different pixels are laid out as 2×2 subpixel arrangements covered by large microlenses 250, or as single subpixels covered by small microlenses 250. In different embodiments, different pixels may be used, for example, 2×1 or 1×2 pixels. In some embodiments, the shallow well 260 may be lightly doped N-well for conducting charge to metallization.

In some embodiments, a contact 270 (also referred to as a jumper) connects the PIXVD (VDD) 328 to the photodiode, thus emulating a photodiode 210 that is shielded from light. The photodiode 210 that is connected to VDD directly is subjected to a constant drainage of charge, therefore emulating a metal-shielded photodiode. In different embodiments, the contact 270 may be manufactured as heavily doped semiconductor or as a metallization. Therefore, a presence of the contact 270 enables some photodiodes to emulate light-shielded photodiodes, as explained in more detail below with respect to FIGS. 9B and 9C.

Figure 9B:
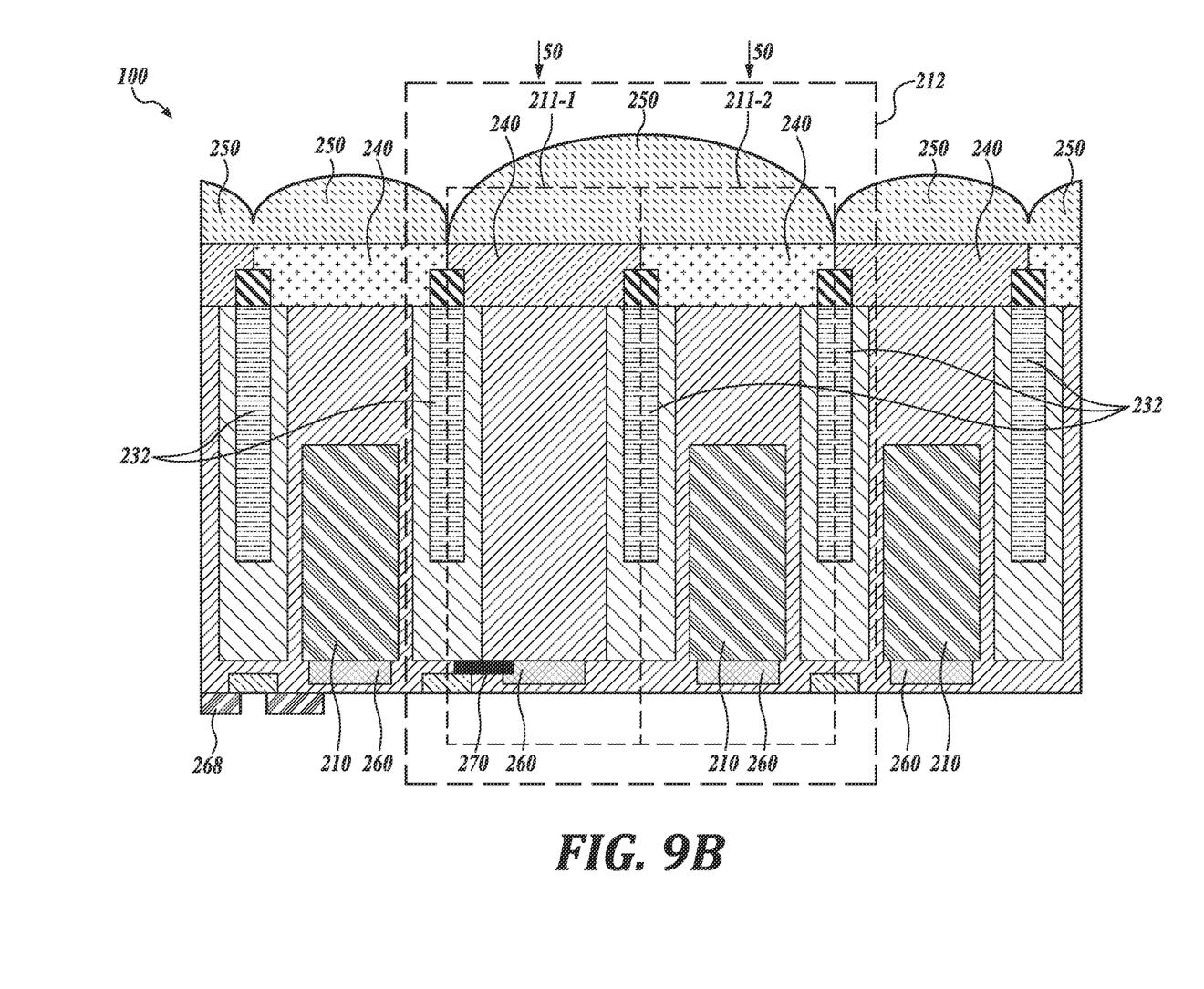
FIGS. 9B and 9C are cross-sectional side views of example image sensors in accordance with embodiments of the present technology.
Figure 9C:
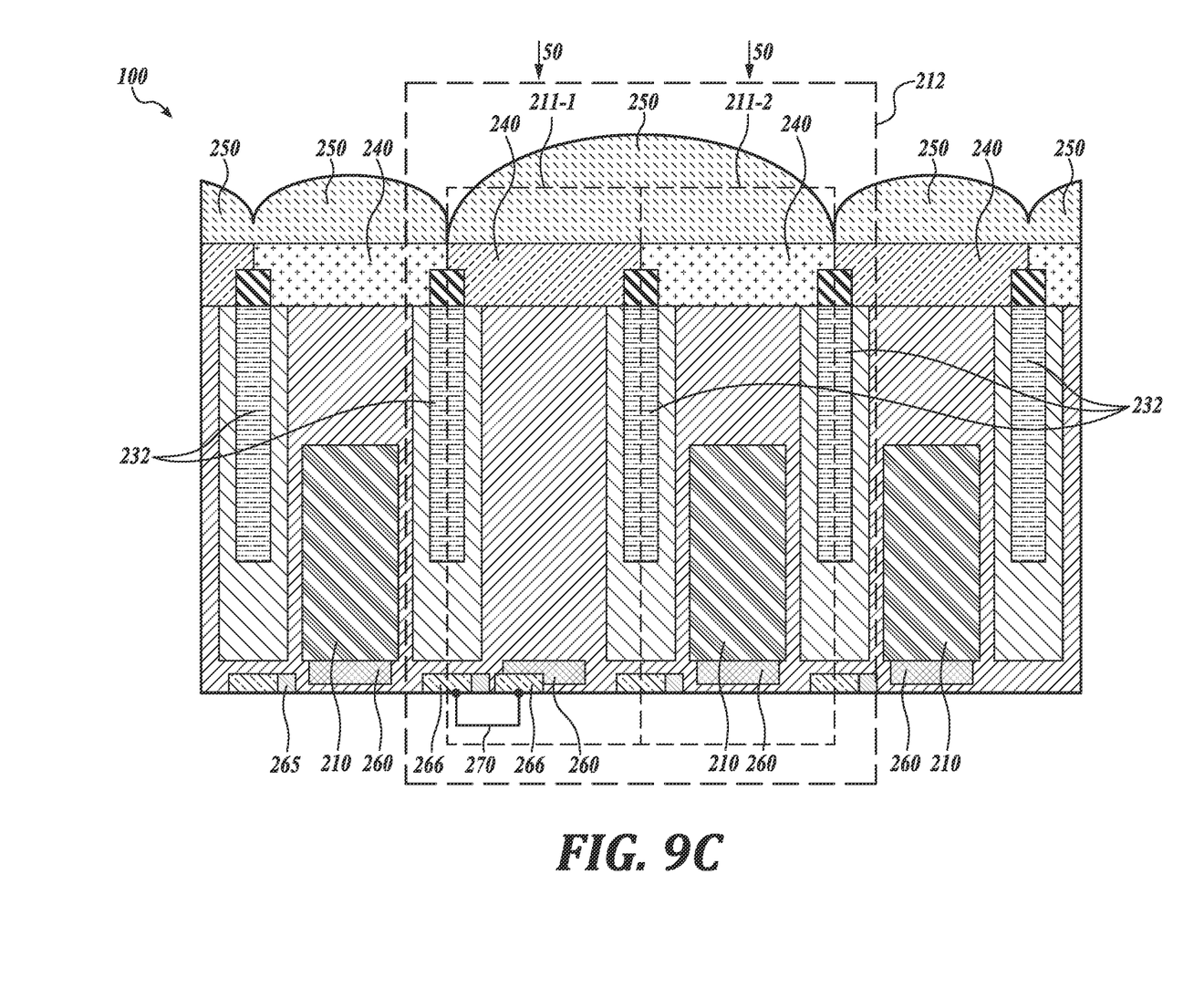

FIGS. 9B and 9C are cross-sectional side views of example image sensors in accordance with embodiments of the present technology. FIG. 9B illustrates an embodiment where the contact 270 electrically couples the photodiode with the PIXVD (VDD) 328. As a result, in operation, the subpixel 211-1 that is connected to the VDD (e.g., through shallow well 260) electrically behaves as if shielded from light, i.e., not generating the photo charge. FIG. 9C illustrates an embodiment where the contact 270 electrically couples two conductive elements 266. In some embodiments, the conductive elements 266 may be placed on the Si surface, as opposed to being buried inside the silicon. In either case, such connection with the VDD again causes the subpixel 211-1 to behave as if shielded from light when the contact 270 is connected to VDD 328.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a plurality of pixels arranged in rows and columns of a pixel array disposed in a semiconductor material, wherein each pixel comprises a plurality of subpixels that are configured to receive incoming light through an illuminated surface of the semiconductor material,
wherein the plurality of pixels comprises at least one autofocusing phase detection (PDAF) pixel comprising:
a first subpixel without a light shielding, wherein the first subpixel generates a first electrical output, and
a second subpixel without the light shielding, wherein the second subpixel generates a second electrical output,
wherein an autofocusing of the image sensor is at least in part determined based on an absence of a photodiode from at least one subpixel, and based on combining the first electrical output of the first subpixel and the second electrical output of the second subpixel,
wherein the second subpixel includes the photodiode, and wherein the first subpixel does not include the photodiode.

2. The image sensor of claim 1, wherein the first subpixel is configured to emulate the light shielding by setting a transfer gate transistor (TX) to a permanent ON state during operation of the image sensor.

3. The image sensor of claim 2, wherein the TX of the first subpixel is set to the permanent ON state during operation of the image sensor by connecting a gate of the TX to a pixel voltage supply (PIXVD).

4. The image sensor of claim 1, wherein the first subpixel is configured to emulate the light shielding by setting a transfer gate transistor (TX) to a permanent OFF state during operation of the image sensor.

5. The image sensor of claim 4, wherein the TX of the first subpixel is set to the permanent OFF state during operation of the image sensor by connecting a gate of the TX to an electrical ground.

6. The image sensor of claim 1, wherein the second subpixel comprises a shallow well configured to electrically connect the photodiode of the second subpixel with to a pixel voltage supply (PIXVD) through a metallization.

7. The image sensor of claim 6, wherein the first subpixel does not include the shallow well.

8. The image sensor of claim 1, wherein the second subpixel comprises a second shallow well configured to electrically connect the photodiode of the second subpixel with pixel voltage supply (PIXVD) through a second metallization that is electrically coupled to the transfer gate transistor (TX) of the second subpixel.

9. The image sensor of claim 1, wherein the first subpixel comprises:
a contact;
a shallow well; and
a metallization that is connected to a pixel voltage supply (PIXVD),
wherein the contact is configured for electrically coupling the shallow well with the pixel voltage supply (PIXVD) through the metallization connected to the pixel voltage supply (PIXVD).

10. The image sensor of claim 9, wherein the first subpixel is configured to emulate the light shielding by setting a transfer gate transistor (TX) to a permanent ON state during operation of the image sensor.

11. The image sensor of claim 9, wherein the contact is a metal jumper.

12. The image sensor of claim 9, wherein the contact is a heavily doped semiconductor.

13. The image sensor of claim 1, wherein the second subpixel and the first subpixel each include a metallization.

* * * * *